United States Patent
Chen et al.

(10) Patent No.: US 9,842,829 B2
(45) Date of Patent: Dec. 12, 2017

(54) CHIP PACKAGE STRUCTURE AND METHOD FOR FORMING THE SAME

(71) Applicant: Taiwan Semiconductor Manufacturing Co., Ltd., Hsinchu (TW)

(72) Inventors: Shao-Yun Chen, Taoyuan (TW); Hsien-Wei Chen, Hsinchu (TW); An-Jhih Su, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/270,559

(22) Filed: Sep. 20, 2016

(65) Prior Publication Data
US 2017/0317058 A1 Nov. 2, 2017

Related U.S. Application Data

(60) Provisional application No. 62/329,833, filed on Apr. 29, 2016.

(51) Int. Cl.
| H01L 23/495 | (2006.01) |
| H01L 25/065 | (2006.01) |
| H01L 23/00 | (2006.01) |
| H01L 23/31 | (2006.01) |

(52) U.S. Cl.
CPC ...... *H01L 25/0657* (2013.01); *H01L 23/3128* (2013.01); *H01L 24/17* (2013.01); *H01L 2224/0401* (2013.01); *H01L 2224/04042* (2013.01); *H01L 2224/1703* (2013.01); *H01L 2225/0651* (2013.01); *H01L 2225/0652* (2013.01); *H01L 2225/06541* (2013.01); *H01L 2225/06568* (2013.01)

(58) Field of Classification Search
CPC ............ H01L 23/3128; H01L 25/0657; H01L 2224/0401; H01L 2225/0651
USPC .................................................. 257/686, 774
See application file for complete search history.

(56) References Cited

U.S. PATENT DOCUMENTS

| 6,265,772 B1 * | 7/2001 | Yoshida ............. H01L 23/3677 257/712 |
| 7,564,115 B2 | 7/2009 | Chen et al. |
| 7,633,165 B2 | 12/2009 | Hsu et al. |
| 7,667,313 B2 * | 2/2010 | Kawabata ........... H01L 25/0652 257/686 |

(Continued)

*Primary Examiner* — Nitin Parekh
(74) *Attorney, Agent, or Firm* — Birch, Stewart, Kolasch & Birch, LLP

(57) ABSTRACT

A chip package structure is provided. The chip package structure includes a substrate. The chip package structure includes a chip package stacked over the substrate. The chip package structure includes first conductive bumps arranged between and in direct contact with the chip package and the substrate providing a clearance. The chip package structure includes a chip structure having a first face and an opposing second face arranged in the clearance between the chip package and the substrate and adjacent to the first conductive bumps. The chip structure contains at least one chip. The chip package structure includes a solder cap connecting the first face of the chip structure and the chip package. The chip package structure includes a second conductive bump connecting the second face of the chip structure and the substrate.

20 Claims, 7 Drawing Sheets

(56) References Cited

U.S. PATENT DOCUMENTS

| | | |
|---|---|---|
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,716,065 B2 * | 5/2014 | Chi .................. H01L 23/3135 257/686 |
| 8,779,606 B2 * | 7/2014 | Yim .................. H01L 23/10 257/686 |
| 8,802,504 B1 | 8/2014 | Hou et al. |
| 8,803,292 B2 | 8/2014 | Chen et al. |
| 8,803,316 B2 | 8/2014 | Lin et al. |
| 2008/0136004 A1 * | 6/2008 | Yang .................. H01L 24/96 257/686 |
| 2010/0102428 A1 * | 4/2010 | Lee .................. H01L 25/0657 257/686 |
| 2010/0308443 A1 * | 12/2010 | Suthiwongsunthorn .................. H01L 21/486 257/621 |
| 2011/0304015 A1 * | 12/2011 | Kim .................. H01L 23/552 257/532 |
| 2012/0074586 A1 * | 3/2012 | Seo .................. H01L 25/16 257/774 |
| 2012/0171814 A1 * | 7/2012 | Choi .................. H01L 21/561 438/107 |
| 2014/0001645 A1 | 1/2014 | Lin et al. |
| 2014/0225258 A1 | 8/2014 | Chiu et al. |
| 2014/0252572 A1 | 9/2014 | Hou et al. |
| 2014/0273348 A1 * | 9/2014 | Yim .................. H01L 23/10 438/107 |
| 2015/0287697 A1 | 10/2015 | Tsai et al. |
| 2015/0348872 A1 | 12/2015 | Kuo et al. |

* cited by examiner

FIG. 4

CHIP PACKAGE STRUCTURE AND METHOD FOR FORMING THE SAME

CROSS REFERENCE TO RELATED APPLICATIONS

This application claims the benefit of U.S. Provisional Application No. 62/329,833, filed on Apr. 29, 2016, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 4 is a cross-sectional view of a chip package structure, in accordance with some embodiments.

DETAILED DESCRIPTION

Figure 1A:
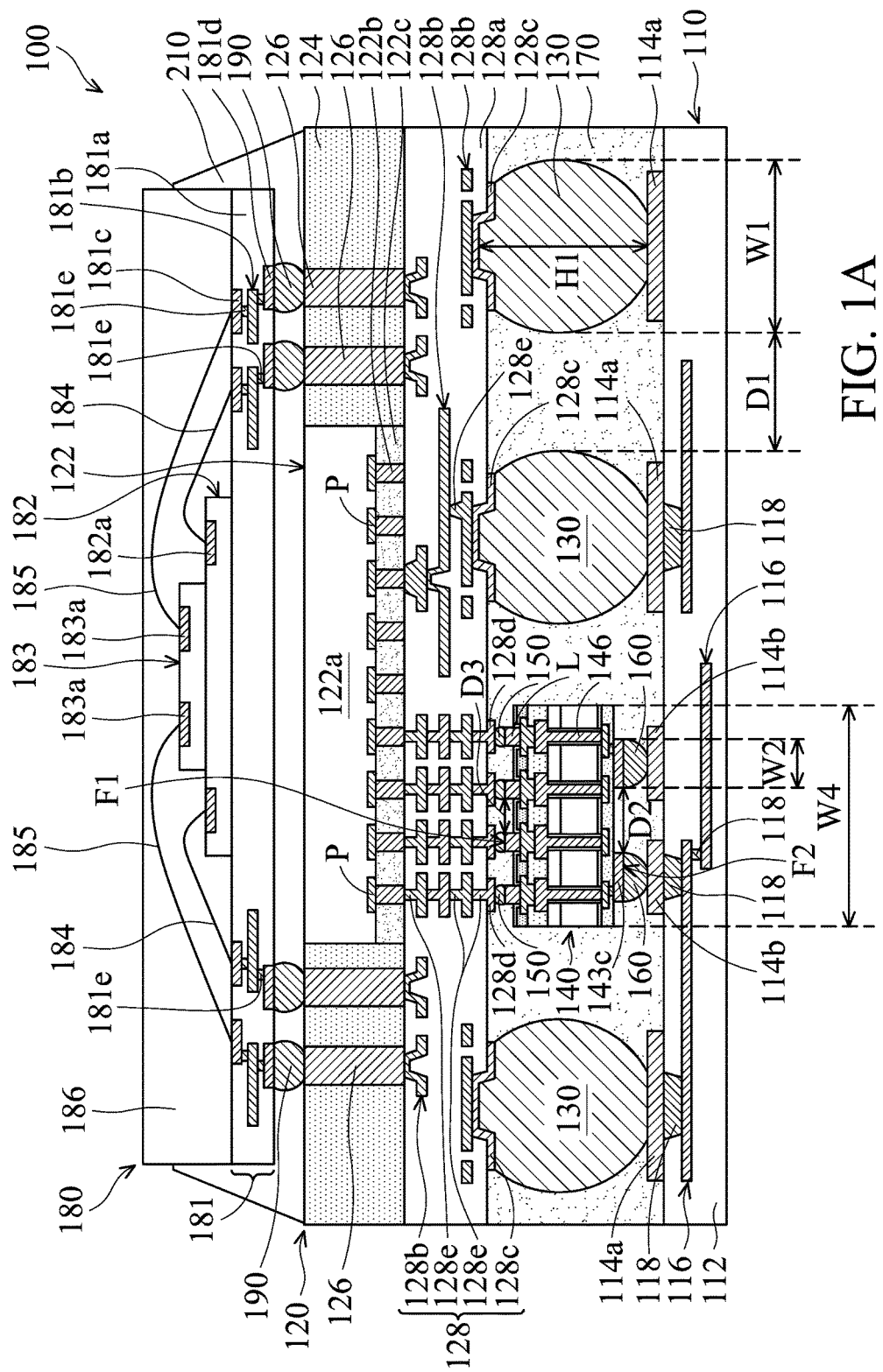
FIG. 1A is a cross-sectional view of a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
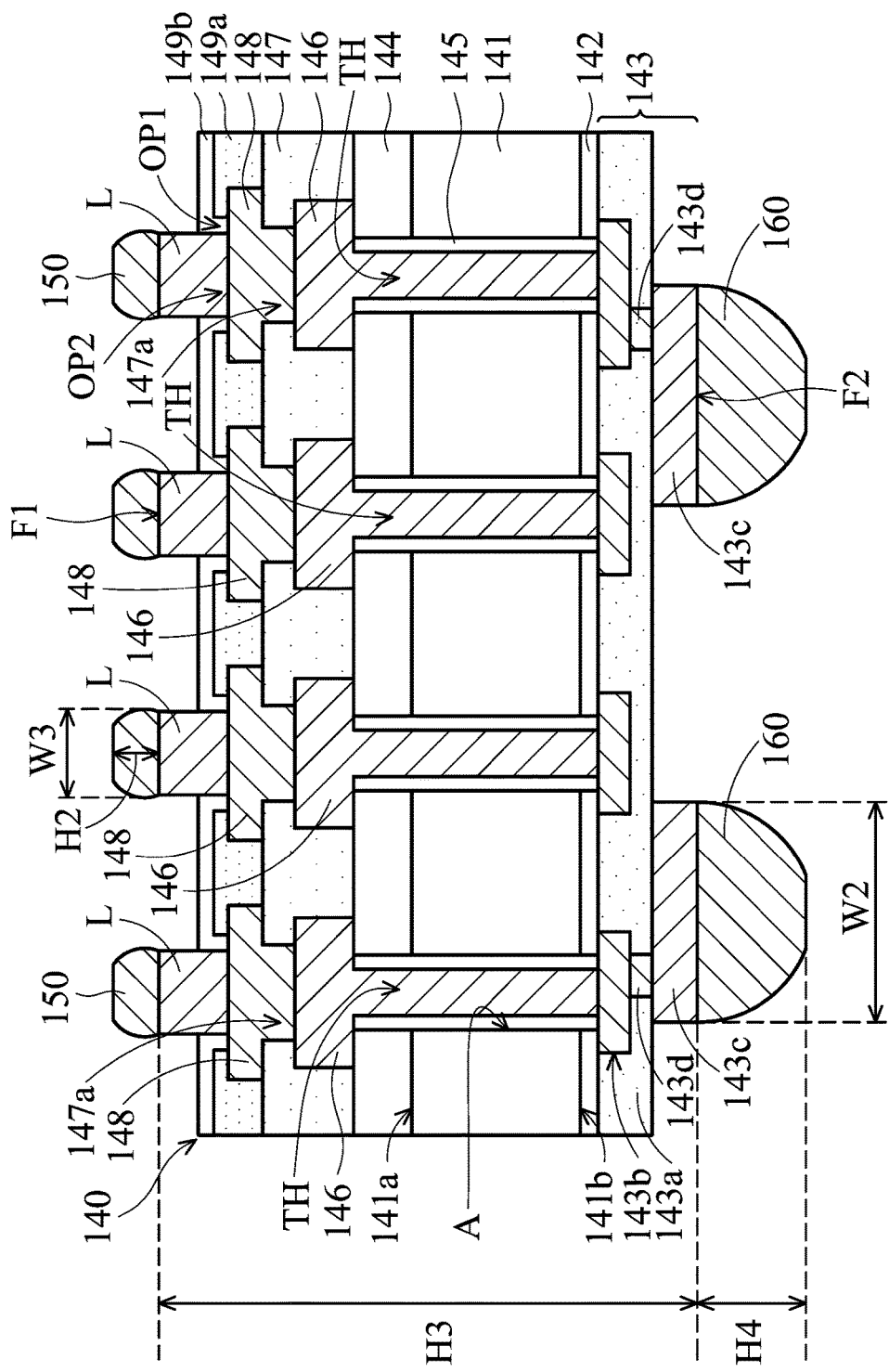
FIG. 1B is a cross-sectional view of a chip structure, solder caps, and conductive bumps of the chip package structure, in accordance with some embodiments.

FIG. 1A is a cross-sectional view of a chip package structure 100, in accordance with some embodiments. FIG. 1B is a cross-sectional view of a chip structure, solder caps, and conductive bumps of the chip package structure 100, in accordance with some embodiments.

As shown in FIG. 1A, a chip package structure 100 is provided, in accordance with some embodiments. The chip package structure 100 includes a substrate 110, a chip package 120, conductive bumps (e.g., solder balls) 130, a chip structure 140, solder caps 150, and conductive bumps (e.g., solder balls) 160, in accordance with some embodiments. The substrate 110 includes a printed circuit board (PCB), a chip, or another suitable structure with wiring layers.

The substrate 110 includes a dielectric layer 112, conductive pads 114a and 114b, wiring layers 116, and conductive vias 118, in accordance with some embodiments. The conductive pads 114a and 114b are formed over the dielectric layer 112, in accordance with some embodiments.

The wiring layers 116 and the conductive vias 118 are formed in the dielectric layer 112, in accordance with some embodiments. The conductive vias 118, the wiring layers 116, and the conductive pads 114a and 114b are electrically connected to each other, in accordance with some embodiments.

The chip package 120 is disposed over the substrate 110, in accordance with some embodiments. The chip package 120 includes a fan-out package, in accordance with some embodiments. The chip package 120 includes a chip structure 122, a molding compound 124, conductive via structures 126, and a redistribution structure 128, in accordance with some embodiments.

The chip structure 122 includes a chip 122a, interconnection structures 122b, and an insulating layer 122c, in accordance with some embodiments. The interconnection structures 122b are formed under the chip 122a to be electrically connected to conductive pads P of the chip 122a, in accordance with some embodiments. The interconnection structures 122b include conductive pillars or conductive bumps, in accordance with some embodiments.

The insulating layer 122c is formed under the chip 122a and surrounds the interconnection structures 122b, in accordance with some embodiments. The insulating layer 122c includes a polymer material or another suitable insulating material. The insulating layer 122c and the interconnection structures 122b are in direct contact with the conductive pads P, in accordance with some embodiments.

The molding compound 124 continuously surrounds the chip structure 122 (or the chip 122a), in accordance with some embodiments. The molding compound 124 includes a polymer material or another suitable insulating material. The molding compound 124 is in direct contact with the insulating layer 122c, the chip 122a, and the redistribution structure 128, in accordance with some embodiments.

The conductive via structures 126 pass through the molding compound 124, in accordance with some embodiments. The conductive via structures 126 include conductive plugs, in accordance with some embodiments. The conductive via structures 126 include copper, tungsten, aluminum, or another suitable conductive material.

The redistribution structure 128 is formed under the chip structure 122, the molding layer 124, and the conductive via structures 126, in accordance with some embodiments. The redistribution structure 128 is between the chip 122a and the conductive bumps 130 and between the molding compound 124 and the conductive bumps 130, in accordance with some embodiments.

The redistribution structure 128 includes a dielectric layer 128a, redistribution layers 128b, conductive pads 128c and 128d, and conductive vias 128e, in accordance with some embodiments. The redistribution layers 128b and conductive vias 128e are in the dielectric layer 128a, in accordance with some embodiments.

The conductive pads 128c and 128d are over the dielectric layer 128a, in accordance with some embodiments. The conductive vias 128e are between the conductive pads 128c and 128d, the redistribution layers 128b, the conductive via structures 126, and the interconnection structures 122b, in accordance with some embodiments.

Therefore, the conductive pads 128c and 128d, the redistribution layers 128b, the conductive via structures 126, and the interconnection structures 122b are able to be electrically connected to each other through the conductive vias 128e according to design requirements, in accordance with some embodiments. The redistribution layers 128b are electrically connected to the conductive via structures 126, in accordance with some embodiments.

The conductive bumps 130 are disposed between the chip package 120 and the substrate 110, in accordance with some embodiments. Each of the conductive bumps 130 is disposed between the conductive pad 128c thereover and the conductive pad 114a thereunder, in accordance with some embodiments. The conductive bumps 130 are in direct contact with and electrically connected to the chip package 120 and the substrate 110, in accordance with some embodiments.

Each of the conductive bumps 130 is in direct contact with and electrically connected to the conductive pad 128c thereover and the conductive pad 114a thereunder, in accordance with some embodiments. In some embodiments, some of the conductive bumps 130 are not between the chip 122a of the chip package 120 and the substrate 110.

As shown in FIGS. 1A and 1B, the chip structure 140 is disposed between the chip package 120 and the substrate 110, in accordance with some embodiments. The chip structure 140 has a first face F1 and an opposing second face F2, in accordance with some embodiments. The first face F1 faces the chip package 120, in accordance with some embodiments. The second face F2 faces the substrate 110, in accordance with some embodiments. The chip structure 140 is arranged adjacent to the conductive bumps 130, in accordance with some embodiments. The chip structure 140 is between the conductive bumps 130, in accordance with some embodiments. The conductive bumps 130 are distributed surrounding the chip structure 140, in accordance with some embodiments.

As shown in FIGS. 1A and 1B, the chip structure 140 includes a chip 141, an insulating layer 142, a redistribution structure 143, insulating layers 144 and 145, conductive via structures 146, an insulating layer 147, conductive pads 148, insulating layers 149a and 149b, and conductive pillars L, in accordance with some embodiments.

The chip 141 has opposite surfaces 141a and 141b, in accordance with some embodiments. The insulating layer 142 is formed over the surface 141b, in accordance with some embodiments. The redistribution structure 143 is formed over the insulating layer 142, in accordance with some embodiments.

The redistribution structure 143 includes a dielectric layer 143a, redistribution layers 143b, conductive pads 143c, and conductive vias 143d, in accordance with some embodiments. The redistribution layers 143b and conductive vias 143d are in the dielectric layer 143a, in accordance with some embodiments. The conductive pads 143c are over the dielectric layer 143a, in accordance with some embodiments.

The conductive vias 143d are between the conductive pads 143c and the redistribution layers 143b, in accordance with some embodiments. Therefore, the conductive pads 143c and the redistribution layers 143b are able to be electrically connected to each other through the conductive vias 143d according to design requirements, in accordance with some embodiments.

As shown in FIG. 1B, through holes TH passing through the chip 141 and the insulating layers 142 and 144 are formed, in accordance with some embodiments. The insulating layer 145 is formed over inner walls A of the through holes TH, in accordance with some embodiments.

The conductive via structures 146 are formed in the respective through holes TH, in accordance with some embodiments. The conductive via structures 146 pass through the chip 141, in accordance with some embodiments. As shown in FIG. 1B, a portion of the conductive via structure 146 extends outside of the corresponding through hole TH and extends onto the insulating layer 144, in accordance with some embodiments.

The insulating layer 147 is formed over the insulating layer 144 and covers portions of the conductive via structures 146, in accordance with some embodiments. The insulating layer 147 has openings 147a, in accordance with some embodiments. The openings 147a expose the respective conductive via structures 146 thereunder, in accordance with some embodiments.

The conductive pads 148 are formed in the respective openings 147a, in accordance with some embodiments. A portion of the conductive pad 148 extends outside of the opening 147a and extends onto the insulating layer 147, in accordance with some embodiments.

The insulating layer 149a is formed over the insulating layer 147 and covers portions of the conductive pads 148, in accordance with some embodiments. The insulating layer 149a has openings OP1, in accordance with some embodiments. The openings OP1 expose the respective conductive pads 148 thereunder, in accordance with some embodiments.

The insulating layer 149b is formed over the insulating layer 149a and covers portions of the conductive pads 148, in accordance with some embodiments. The insulating layer 149b has openings OP2, in accordance with some embodiments. The openings OP2 expose the respective conductive pads 148 thereunder, in accordance with some embodiments.

The conductive pillars L are formed in the respective openings OP2, in accordance with some embodiments. A portion of the conductive pillar L extends outside of the corresponding opening OP2, in accordance with some embodiments.

The conductive structures of the chip structure 140 (e.g., the redistribution layers 143b, the conductive pads 143c, the conductive vias 143d, the conductive via structures 146, the conductive pads 148, or the conductive pillars L) include copper, aluminum, tungsten, or another suitable conductive material.

As shown in FIG. 1B, solder caps 150 are formed over the respective conductive pillars L, in accordance with some embodiments. The solder caps 150 include a solder material, such as tin, in accordance with some embodiments. As shown in FIG. 1B, conductive bumps 160 are formed over the respective conductive pads 143c, in accordance with some embodiments. The conductive bumps 130 and 160 include a solder material, such as tin, in accordance with some embodiments.

As shown in FIGS. 1A and 1B, the solder caps 150 are positioned between the chip package 120 and the chip structure 140, in accordance with some embodiments. The solder caps 150 are in direct contact with the chip package 120 and the chip structure 140, in accordance with some embodiments. The solder caps 150 connect the first face F1 of the chip structure 140 and the chip package 120, in accordance with some embodiments. Each of the solder caps 150 is positioned between the conductive pillar L thereunder and the conductive pad 128d thereover, in accordance with some embodiments.

Each of the solder caps 150 is in direct contact with the conductive pillar L thereunder and the conductive pad 128d thereover, in accordance with some embodiments. Each of the solder caps 150 is electrically connected to the conductive pillar L thereunder and the conductive pad 128d thereover, in accordance with some embodiments.

As shown in FIGS. 1A and 1B, the conductive bumps 160 are positioned between the chip structure 140 and the substrate 110, in accordance with some embodiments. The conductive bumps 160 are in direct contact with the chip structure 140 and the substrate 110, in accordance with some embodiments. The conductive bumps 160 connect the second face F2 of the chip structure 140 and the substrate 110, in accordance with some embodiments. Each of the conductive bumps 160 is positioned between the conductive pad 114b thereunder and the conductive pad 143c thereover, in accordance with some embodiments.

Each of the conductive bumps 160 is in direct contact with the conductive pad 114b thereunder and the conductive pad 143c thereover, in accordance with some embodiments. Each of the conductive bumps 160 is electrically connected to the conductive pad 114b thereunder and the conductive pad 143c thereover, in accordance with some embodiments. The conductive via structures 146 electrically connect the solder caps 150 to the conductive bumps 160, in accordance with some embodiments.

In some embodiments, a maximum width W1 of the conductive bump 130 is greater than a maximum width W2 of the conductive bump 160. In some embodiments, the maximum width W2 of the conductive bump 160 is greater than a maximum width W3 of the solder cap 150. In some embodiments, a maximum width W4 of the chip structure 140 is greater than the maximum width W1 of the conductive bump 130.

In some embodiments, a distance D1 between two adjacent conductive bumps 130 is greater than a distance D2 between two adjacent conductive bumps 160. In some embodiments, the distance D2 between two adjacent conductive bumps 160 is greater than a distance D3 between two adjacent solder caps 150.

In some embodiments, the solder cap 150, the chip structure 140, and the conductive bump 160 have maximum heights H2, H3, and H4 respectively. In some embodiments, a maximum height H1 of the conductive bump 130 is equal to or greater than a maximum total height (H2+H3+H4) of the solder cap 150, the chip structure 140, and the conductive bump 160.

As shown in FIG. 1A, the chip package structure 100 further includes a filling layer 170, in accordance with some embodiments. The filling layer 170 is filled between the chip package 120 and the substrate 110, in accordance with some embodiments.

The filling layer 170 continuously surrounds the conductive bumps 130 and 160, the chip structure 140, and the solder caps 150, in accordance with some embodiments. The filling layer 170 includes an insulating material (e.g., a polymer material), in accordance with some embodiments.

As shown in FIG. 1A, the chip package structure 100 further includes a chip package 180, in accordance with some embodiments. The chip package 180 is disposed over the chip package 120, in accordance with some embodiments. The chip package 180 includes a redistribution structure 181, chips 182 and 183, conductive wires 184 and 185, and a molding compound 186, in accordance with some embodiments.

The redistribution structure 181 includes a dielectric layer 181a, redistribution layers 181b, conductive pads 181c and 181d, and conductive vias 181e, in accordance with some embodiments. The redistribution layers 181b and conductive vias 181e are in the dielectric layer 181a, in accordance with some embodiments. The conductive pads 181c and 181d are over opposite sides of the dielectric layer 181a, in accordance with some embodiments.

The conductive vias 181e are between the conductive pads 181c and 181d and the redistribution layers 181b, in accordance with some embodiments. Therefore, the conductive pads 181c and 181d and the redistribution layers 181b are able to be electrically connected to each other through the conductive vias 181e according to design requirements, in accordance with some embodiments.

The chip 182 is disposed over the redistribution structure 181, in accordance with some embodiments. The conductive wires 184 (electrically) connect respective conductive pads 182a of the chip 182 to the respective conductive pads 181c, in accordance with some embodiments.

The chip 183 is disposed over the chip 182, in accordance with some embodiments. The conductive wires 185 (electrically) connect respective conductive pads 183a of the chip 183 to the respective conductive pads 181c, in accordance with some embodiments.

The molding compound 186 is formed over the redistribution structure 181 to cover the chips 182 and 183 and the conductive wires 184 and 185, in accordance with some embodiments. The molding compound 186 includes an insulating material (e.g., a polymer material), in accordance with some embodiments.

As shown in FIG. 1A, the chip package structure 100 further includes conductive bumps 190, in accordance with some embodiments. The conductive bumps 190 are formed between the conductive pads 181*d* and the conductive via structures 126, in accordance with some embodiments. The conductive bumps 190 electrically connect the conductive pads 181*d* to the conductive via structures 126, in accordance with some embodiments.

As shown in FIG. 1A, the chip package structure 100 further includes a filling layer 210, in accordance with some embodiments. The filling layer 210 is filled between the chip packages 180 and 120, in accordance with some embodiments. The filling layer 210 continuously surrounds the conductive bumps 190 and the chip package 180, in accordance with some embodiments.

The filling layer 210 includes an insulating material (e.g., a polymer material), in accordance with some embodiments. The filling layer 210 further extends onto the sidewalls of the dielectric layer 181*a* and the molding compound 186, in accordance with some embodiments. The filling layer 210 surrounds the dielectric layer 181*a* and the molding compound 186, in accordance with some embodiments.

Since the chip structure 140 has the conductive via structures 146 to electrically connect the chip package 120 to the substrate 110, the chip structure 140 has the function of the conductive bump(s) 130, in accordance with some embodiments.

Therefore, the chip structure 140 maintains or increases the conductive paths between the chip package 120 and the substrate 110, in accordance with some embodiments. As a result, the chip structure 140 improves the routability of the redistribution structure 128 and the wiring layers 116, in accordance with some embodiments.

Furthermore, the chip structure 140 further has active devices and/or passive devices. Therefore, the chip package structure 100 with the chip structure 140 has devices more than the chip package structure without the chip structure 140 and with the same size as the chip package structure 100, in accordance with some embodiments.

That is, the chip structure 140 increases the device density of the chip package structure 100, in accordance with some embodiments. As a result, the performance of the chip package structure 100 is improved.

Figure 2:
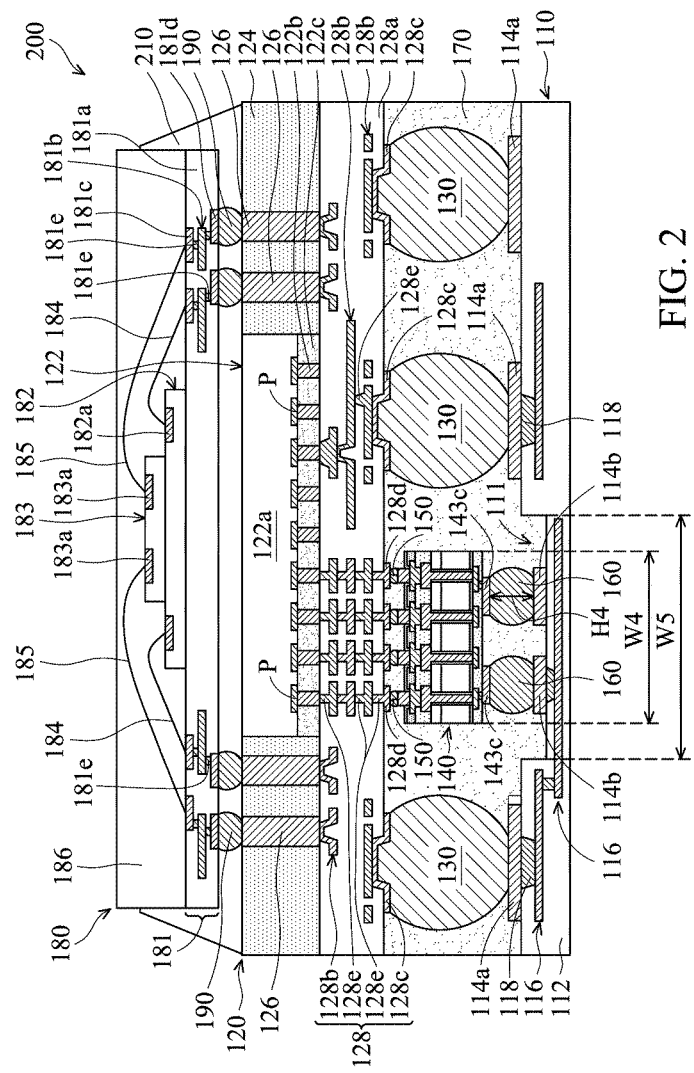
FIG. 2 is a cross-sectional view of a chip package structure, in accordance with some embodiments.

FIG. 2 is a cross-sectional view of a chip package structure 200, in accordance with some embodiments. As shown in FIG. 2, the chip package structure 200 is similar to the chip package structure 100, except that the substrate 110 of the chip package structure 200 further has a recess 111, in accordance with some embodiments. The conductive pads 114*b* are formed in the recess 111 and over the dielectric layer 112, in accordance with some embodiments.

The chip structure 140 is over the recess 111, in accordance with some embodiments. The chip structure 140 includes active devices and/or passive devices, in accordance with some embodiments. The width W5 of the recess 111 is greater than the width W4 of the chip structure 140, in accordance with some embodiments. The conductive bumps 160 are formed between the chip structure 140 and the conductive pads 114*b*, in accordance with some embodiments.

All of the conductive bumps 160 are in the recess 111, in accordance with some embodiments. The solder caps 150 are over the recess 111, in accordance with some embodiments. The solder caps 150 are between the chip structure 140 and the conductive pads 128*d*, in accordance with some embodiments.

Since the substrate 110 has the recess 111, the maximum heights H2, H3, and H4 (as shown in FIG. 1B) of the solder cap 150, the chip structure 140, and the conductive bump 160 are enlarged, in accordance with some embodiments. Therefore, devices and redistribution layers of the chip structure 140 may be increased. The structural strength of the chip structure 140 may be improved.

Since the maximum height H4 of the conductive bump 160 is enlarged, the size of the conductive bump 160 is enlarged. Therefore, the connection of the conductive bump 160 to the conductive pad 143*c* thereover and the conductive pad 114*b* thereunder is improved, in accordance with some embodiments.

Figure 3:
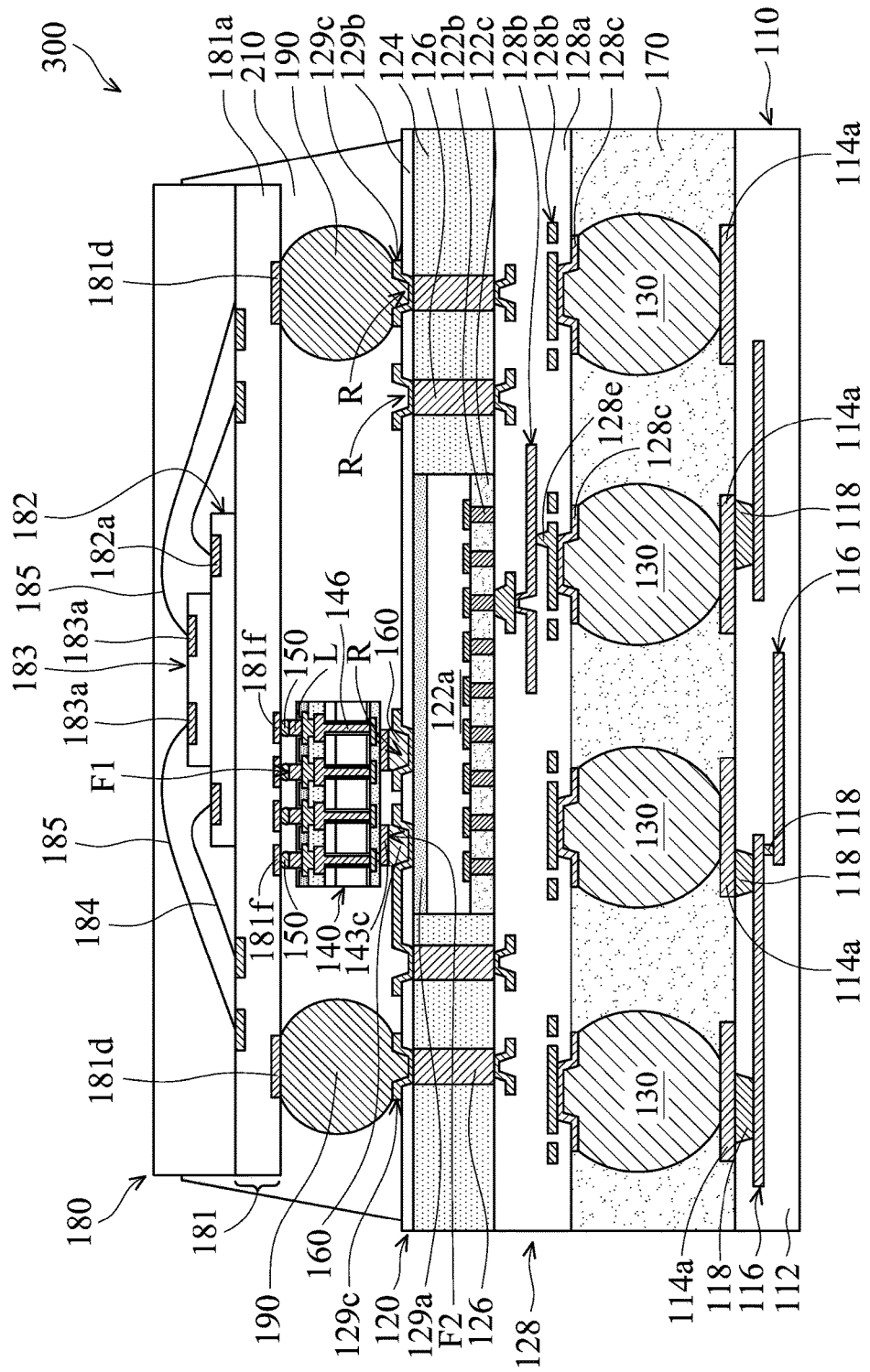
FIG. 3 is a cross-sectional view of a chip package structure, in accordance with some embodiments.

FIG. 3 is a cross-sectional view of a chip package structure 300, in accordance with some embodiments. As shown in FIG. 3, the chip package structure 300 is similar to the chip package structure 100, except that the chip structure 140, the solder caps 150, and the conductive bumps 160 are between the chip packages 120 and 180, in accordance with some embodiments.

The redistribution structure 181 further includes conductive pads 181*f*, in accordance with some embodiments. The conductive pads 181*f* is embedded in the dielectric layer 181*a*, in accordance with some embodiments. The solder caps 150 are between the conductive pads 181*f* and the chip structure 140, in accordance with some embodiments. The conductive pads 181*f* are electrically connected to the chip structure 140 through the solder caps 150, in accordance with some embodiments.

The chip package 120 further includes dielectric layers 129*a* and 129*b* and a redistribution layer 129*c*, in accordance with some embodiments. The dielectric layer 129*a* is formed over the chip 122*a*, in accordance with some embodiments.

The dielectric layer 129*b* is formed over the molding compound 124, the dielectric layer 129*a*, and the conductive via structures 126, in accordance with some embodiments. The dielectric layer 129*b* has recesses R, in accordance with some embodiments. The recesses R expose the conductive via structures 126 and a portion of the dielectric layer 129*a*, in accordance with some embodiments.

The redistribution layer 129*c* is formed over the dielectric layer 129*b* and extends into the recesses R, in accordance with some embodiments. The redistribution layer 129*c* is electrically connected to the conductive via structures 126, in accordance with some embodiments. The conductive bumps 190 are formed between the conductive pads 181*d* and the redistribution layer 129*c*, in accordance with some embodiments.

The conductive bumps 190 electrically connect the conductive pads 181*d* to the redistribution layer 129*c*, in accordance with some embodiments. The conductive bumps 190 are not formed between the chips 182, 183, and 122*a*, in accordance with some embodiments.

The conductive bumps 160 are between the conductive pads 143*c* of the chip structure 140 and the redistribution layer 129*c*, in accordance with some embodiments. The conductive bumps 160 electrically connect the conductive pads 143*c* to the redistribution layer 129*c*, in accordance with some embodiments. The conductive bumps 160 are positioned in the respective recesses R, in accordance with some embodiments.

Since the chip structure 140 has the conductive via structures 146 to electrically connect the chip package 120 to the chip package 180, the chip structure 140 has the function of the conductive bump(s) 190, in accordance with some embodiments.

Therefore, the chip structure 140 maintains or increases the conductive paths between the chip packages 120 and 180, in accordance with some embodiments. As a result, the chip structure 140 improves the routability of the redistribution structure 181 and the redistribution layer 129c, in accordance with some embodiments.

Furthermore, the chip structure 140 further has active devices and/or passive devices. Therefore, the chip package structure 300 with the chip structure 140 has devices more than the chip package structure without the chip structure 140 and with the same size as the chip package structure 300, in accordance with some embodiments. That is, the chip structure 140 increases the device density of the chip package structure 300, in accordance with some embodiments. As a result, the performance of the chip package structure 300 is improved.

Figure 4:
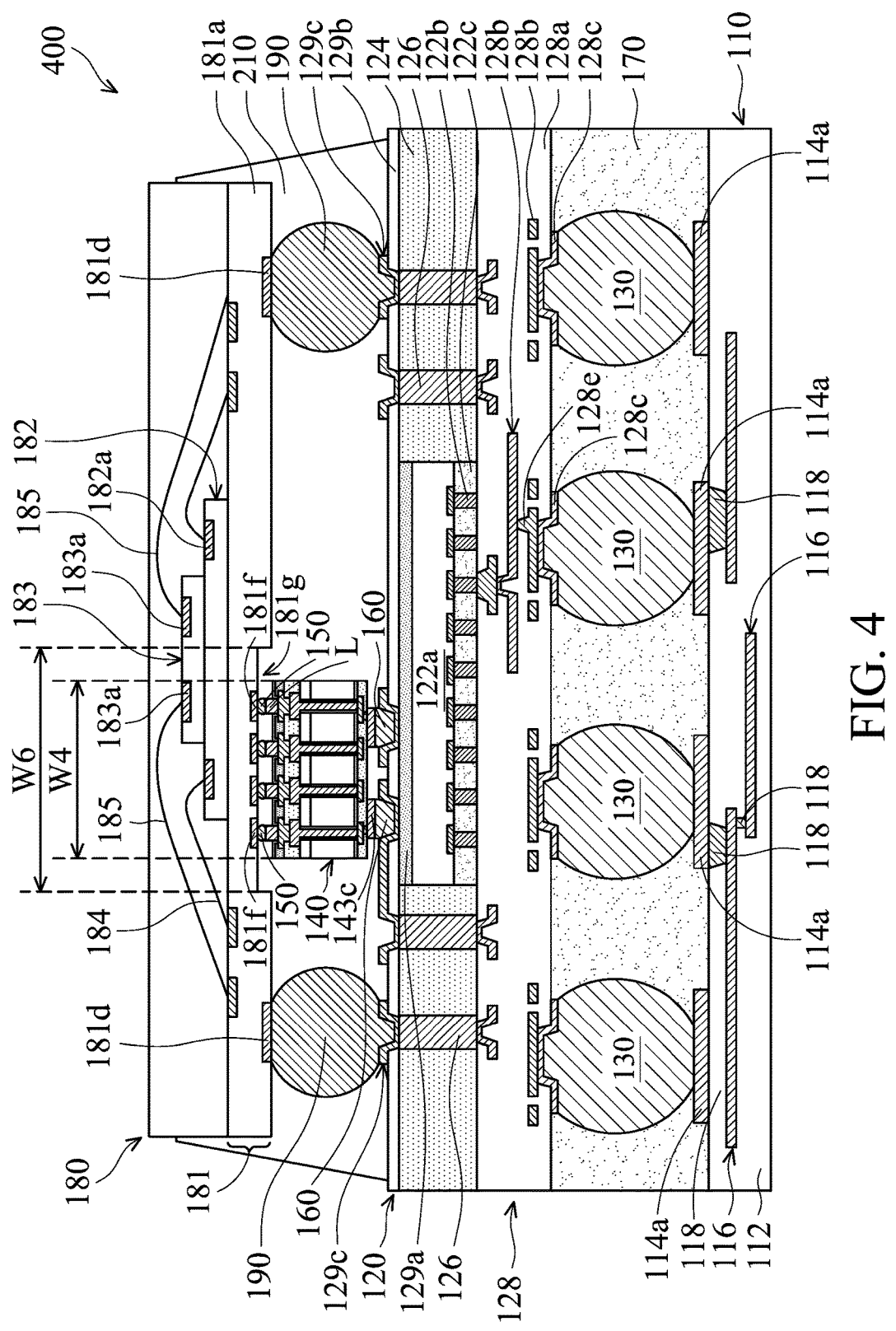

FIG. 4 is a cross-sectional view of a chip package structure 400, in accordance with some embodiments. As shown in FIG. 4, the chip package structure 400 is similar to the chip package structure 300, except that the redistribution structure 181 of the chip package structure 180 further has a recess 181g, in accordance with some embodiments. The solder caps 150 are formed in the recess 181g and between conductive pads 181f and the chip structure 140, in accordance with some embodiments.

All of the solder caps 150 are in the recess 181g, in accordance with some embodiments. The chip structure 140 is under the recess 181g, in accordance with some embodiments. The conductive bumps 160 are under the recess 181g, in accordance with some embodiments. The width W6 of the recess 181g is greater than the width W4 of the chip structure 140, in accordance with some embodiments.

Since the redistribution structure 181 has the recess 181g, the maximum heights H2, H3, and H4 (as shown in FIG. 1B) of the solder cap 150, the chip structure 140, and the conductive bump 160 are enlarged, in accordance with some embodiments. Therefore, devices and redistribution layers of the chip structure 140 may be increased. The structural strength of the chip structure 140 may be improved.

Since the maximum height H4 of the conductive bump 160 is enlarged, the size of the conductive bump 160 is enlarged. Therefore, the connection of the conductive bump 160 to the conductive pad 143c thereover and the redistribution layer 129c thereunder is improved, in accordance with some embodiments.

Figure 5:
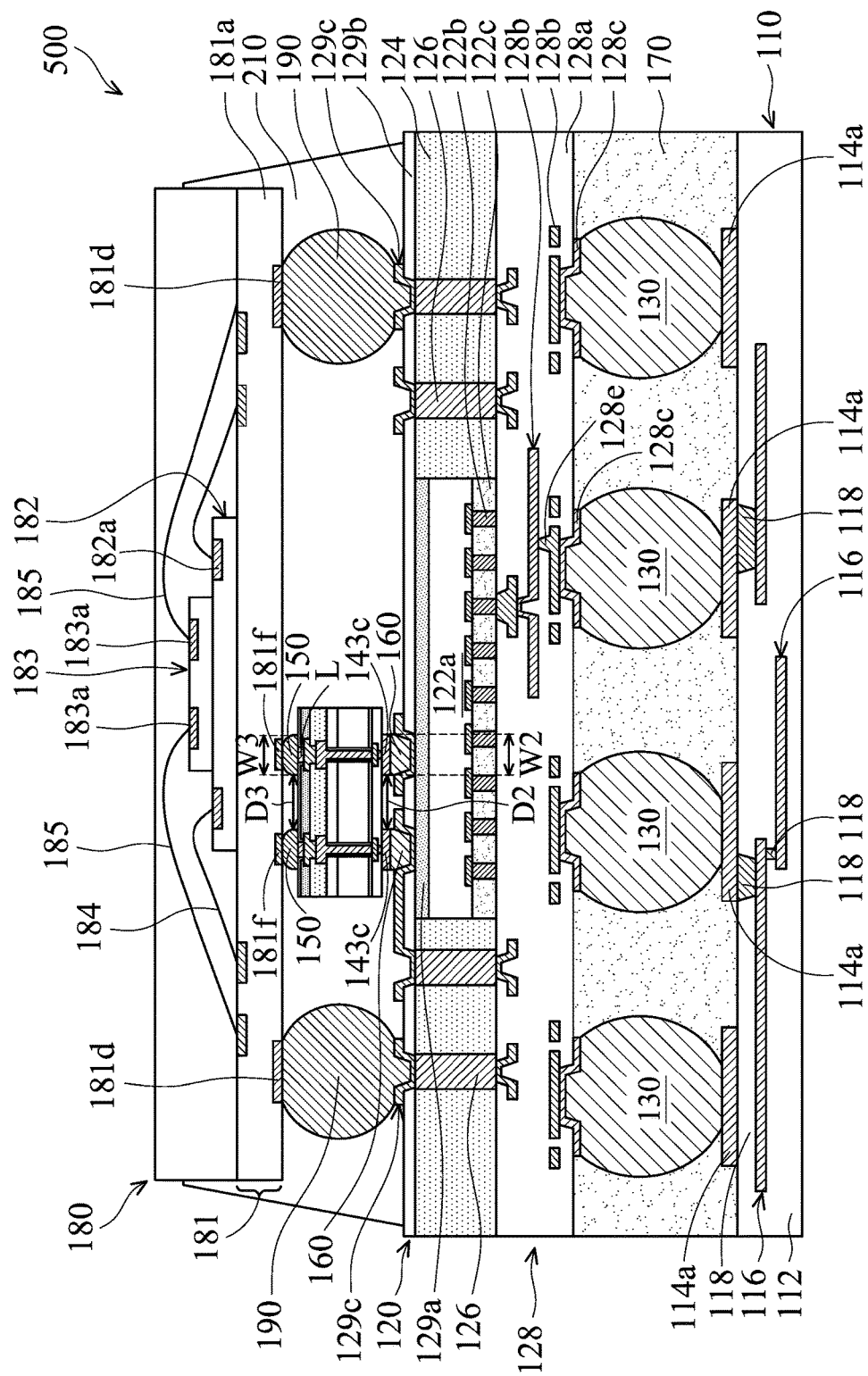
FIG. 5 is a cross-sectional view of a chip package structure, in accordance with some embodiments.

FIG. 5 is a cross-sectional view of a chip package structure 500, in accordance with some embodiments. As shown in FIG. 5, the chip package structure 500 is similar to the chip package structure 300, except that the size and the arrangement of the solder caps 150 of chip package structure 500 are different from that of the chip package structure 300, in accordance with some embodiments.

In some embodiments, the maximum width W2 of the conductive bump 160 is equal to the maximum width W3 of the solder cap 150. In some other embodiments, the maximum width W2 of the conductive bump 160 is less than the maximum width W3 of the solder cap 150.

In some embodiments, the distance D2 between two adjacent conductive bumps 160 is equal to the distance D3 between two adjacent solder caps 150. In some embodiments, the distance D2 between two adjacent conductive bumps 160 is less than the distance D3 between two adjacent solder caps 150.

Figure 6:
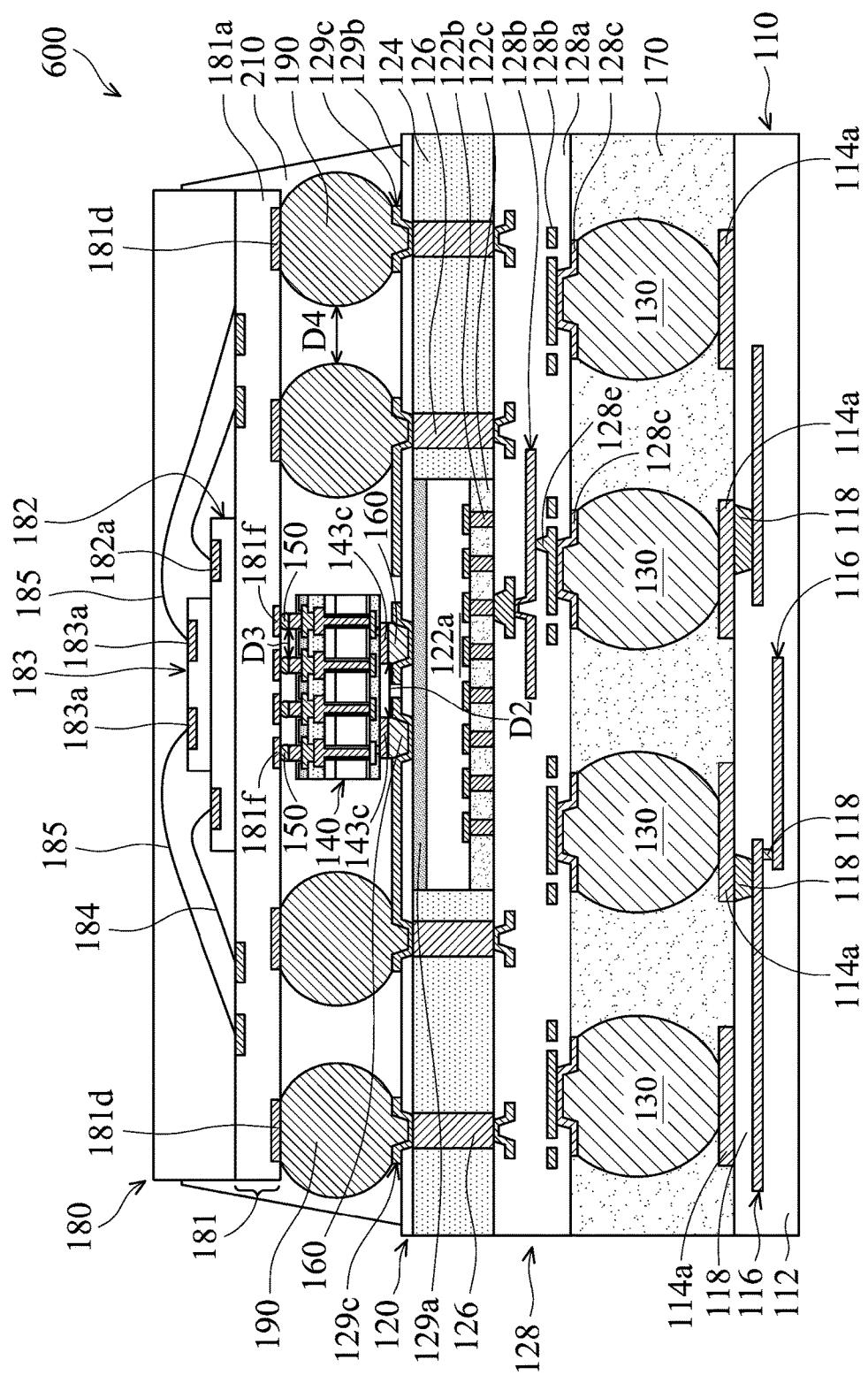
FIG. 6 is a cross-sectional view of a chip package structure, in accordance with some embodiments.

FIG. 6 is a cross-sectional view of a chip package structure 600, in accordance with some embodiments. As shown in FIG. 6, the chip package structure 600 is similar to the chip package structure 300, except that the arrangement of the conductive bumps 190 of chip package structure 600 are different from that of the chip package structure 300, in accordance with some embodiments.

In some embodiments, the distance D4 between two adjacent conductive bumps 190 is greater than the distance D2 between two adjacent conductive bumps 160. In some embodiments, the distance D4 between two adjacent conductive bumps 190 is greater than the distance D3 between two adjacent solder caps 150.

In accordance with some embodiments, chip package structures are provided. The chip package structure has a chip structure between a chip package and a substrate (or another chip package). The chip structure has conductive via structures to electrically connect the chip package to the substrate, and therefore the chip structure has the function of the conductive bump(s). Therefore, the chip structure maintains or increases the conductive paths between the chip package and the substrate. As a result, the chip structure improves the routability of a redistribution structure of the chip package and wiring layers of the substrate. Furthermore, the chip structure further has active devices and/or passive devices. Therefore, the chip structure increases the device density of the chip package structure. As a result, the performance of the chip package structure is improved.

The substrate has recess under the chip structure. Therefore, the maximum height of the chip structure is enlarged. Therefore, devices and redistribution layers of the chip structure are increased. The structural strength of the chip structure is improved.

In accordance with some embodiments, a chip package structure is provided. The chip package structure includes a chip package. The chip package structure includes a substrate. The chip package structure includes first conductive bumps between and in direct contact with the chip package and the substrate. The chip package structure includes a chip structure between the chip package and the substrate and adjacent to the first conductive bumps. The chip package structure includes solder caps between the chip package and the chip structure. The chip package structure includes second conductive bumps between the chip structure and the substrate. The chip package structure includes conductive via structures passing through a chip of the chip structure. The conductive via structures electrically connect the solder caps to the second conductive bumps.

In accordance with some embodiments, a chip package structure is provided. The chip package structure includes a first chip package. The chip package structure includes a second chip package. The chip package structure includes first conductive bumps between and in direct contact with the first chip package and the second chip package. The chip package structure includes a chip structure between the first chip package and the second chip package and adjacent to the first conductive bumps. The chip package structure includes solder caps between the first chip package and the chip structure. The chip package structure includes second conductive bumps between the chip structure and the second chip package.

In accordance with some embodiments, a chip package structure is provided. The chip package structure includes a chip package. The chip package structure includes a substrate. The chip package structure includes first conductive bumps between the chip package and the substrate. The chip package structure includes a chip structure between the chip package and the substrate and adjacent to the first conductive bumps. The chip package structure includes solder caps between the chip package and the chip structure. The chip package structure includes second conductive bumps between the chip structure and the substrate. A maximum height of the first conductive bump is equal to or greater than a maximum total height of the second conductive bump, the chip structure, and the solder cap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
a substrate having a recess;
a chip package stacked over the substrate;
a plurality of first conductive bumps arranged between and in direct contact with the chip package and the substrate providing a clearance;
a chip structure having a first face and an opposing second face arranged in the clearance between the chip package and the substrate and adjacent to the first conductive bumps, wherein the chip structure contains at least one chip, and a first width of the recess is greater than a second width of the chip structure;
a solder cap connecting the first face of the chip structure and the chip package; and
a second conductive bump connecting the second face of the chip structure and the substrate, wherein a portion of the second conductive bump is in the recess, and the entire chip structure is outside of the recess; and
a conductive via structure passing through the chip of the chip structure, wherein the conductive via structure electrically connects the solder cap to the second conductive bump.

2. The chip package structure as claimed in claim 1, wherein the solder cap is in direct contact with the chip package and the chip structure.

3. The chip package structure as claimed in claim 1, wherein the second conductive bump is in direct contact with the chip structure and the substrate.

4. The chip package structure as claimed in claim 1, wherein a first maximum width of the first conductive bump is greater than a second maximum width of the second conductive bump.

5. The chip package structure as claimed in claim 4, wherein the second maximum width of the second conductive bump is greater than a third maximum width of the solder cap.

6. The chip package structure as claimed in claim 1, further comprising:
a third conductive bump connecting the second face of the chip structure and the substrate, wherein the third conductive bump is adjacent to the second conductive bump, and a first distance between two adjacent first conductive bumps is greater than a second distance between the second conductive bump and the third conductive bump.

7. The chip package structure as claimed in claim 6, further comprising:
a first solder cap connecting the first face of the chip structure and the chip package, wherein the second distance between the second conductive bump and the third conductive bump is greater than a third distance between the solder cap and the first solder cap.

8. The chip package structure as claimed in claim 1, wherein an upper portion of the second conductive bump is outside of the recess.

9. The chip package structure as claimed in claim 1, wherein the chip package comprises a chip, a molding compound, and a redistribution structure,
wherein the molding compound continuously surrounds the chip of the chip package, and
wherein the redistribution structure is between the chip of the chip package and the first conductive bumps and between the molding compound and the first conductive bumps.

10. A chip package structure, comprising:
a first chip package having a first chip;
a second chip package having a second chip, wherein the first chip package is stacked over the second chip package;
a plurality of first conductive bumps arranged between and in direct contact with the first chip package and the second chip package providing a clearance;
a chip structure having a first face and an opposing second face arranged in the clearance between the first chip package and the second chip package and adjacent to the first conductive bumps, wherein the chip structure has a third chip, and the first chip, the second chip, and the third chip are separated from each other;
a solder cap connecting the first face of the chip structure and the first chip package; and
a second conductive bump connecting the second face of the chip structure and the second chip package.

11. The chip package structure as claimed in claim 10, further comprising:
a filling layer filled between the first chip package and the second chip package, wherein the filling layer continuously surrounds the first conductive bumps and the chip structure.

12. The chip package structure as claimed in claim 10, wherein the second chip package has a recess, the second conductive bump is in the recess, and the entire chip structure is outside of the recess.

13. The chip package structure as claimed in claim 10, wherein a redistribution structure of the first chip package has a recess, the solder cap is in the recess, and the entire chip structure is outside of the recess.

14. The chip package structure as claimed in claim 10, wherein the chip structure is between the first conductive bumps.

15. The chip package structure as claimed in claim 10, further comprising:
a third conductive bump connecting the second face of the chip structure and the second chip package, wherein the third conductive bump is adjacent to the second conductive bump, and a first distance between two adjacent first conductive bumps is greater than a second distance between the second conductive bump and the third conductive bump.

16. The chip package structure as claimed in claim 10, wherein the first conductive bumps are not between a first chip of the first chip package and a second chip of the second chip package.

17. A chip package structure, comprising:
a substrate having a recess;
a chip package stacked over the substrate;
a plurality of first conductive bumps arranged between the chip package and the substrate providing a clearance;

a chip structure having a first face and an opposing second face arranged in the clearance between the chip package and the substrate and adjacent to the first conductive bumps, wherein a first width of the recess is greater than a second width of the chip structure;

a solder cap connecting the first face of the chip structure and the chip package; and a second conductive bump connecting the second face of the chip structure and the substrate, wherein a maximum height of the first conductive bump is less than a maximum total height of the second conductive bump, the chip structure, and the solder cap, and a portion of the second conductive bump is in the recess, and the entire chip structure is outside of the recess.

18. The chip package structure as claimed in claim 17, wherein the first conductive bumps surround the chip structure.

19. The chip package structure as claimed in claim 17, wherein the chip package comprises a chip, a molding compound, a plurality of conductive via structures, and a redistribution structure, the molding compound continuously surrounds the chip, the conductive via structures pass through the molding compound, and the redistribution structure is under the chip, the molding compound, and the conductive via structures.

20. The chip package structure as claimed in claim 17, wherein an upper portion of the second conductive bump is outside of the recess.

* * * * *